United States Patent
Kwon et al.

(10) Patent No.: US 11,515,174 B2
(45) Date of Patent: Nov. 29, 2022

(54) SEMICONDUCTOR DEVICES WITH PACKAGE-LEVEL COMPARTMENTAL SHIELDING AND ASSOCIATED SYSTEMS AND METHODS

(71) Applicant: Micron Technology, Inc., Boise, ID (US)

(72) Inventors: Youngik Kwon, Taichung (TW); Jong Sik Paek, Taichung (TW)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 16/681,214

(22) Filed: Nov. 12, 2019

(65) Prior Publication Data

US 2021/0143073 A1  May 13, 2021

(51) Int. Cl.
| | |
|---|---|
| *H01L 21/56* | (2006.01) |
| *H01L 23/31* | (2006.01) |
| *H01L 21/67* | (2006.01) |
| *H01L 23/552* | (2006.01) |

(52) U.S. Cl.
CPC ...... *H01L 21/565* (2013.01); *H01L 21/67126* (2013.01); *H01L 23/315* (2013.01); *H01L 23/3135* (2013.01); *H01L 23/552* (2013.01)

(58) Field of Classification Search
CPC .......... H01L 21/67126; H01L 23/3135; H01L 23/315; H01L 21/565; B29C 33/0022
See application file for complete search history.

(56) References Cited

U.S. PATENT DOCUMENTS

| | | | | |
|---|---|---|---|---|
| 6,173,490 | B1* | 1/2001 | Lee | H01L 24/97 |
| | | | | 29/841 |
| 8,053,275 | B2* | 11/2011 | Hasegawa | H01L 24/97 |
| | | | | 438/106 |
| 10,091,918 | B2* | 10/2018 | Zhang | H01L 23/552 |
| 2009/0224266 | A1* | 9/2009 | Wang | G02B 6/0073 |
| | | | | 257/88 |
| 2010/0081237 | A1* | 4/2010 | Wong | H01L 23/3121 |
| | | | | 257/E21.001 |
| 2016/0093576 | A1* | 3/2016 | Chiu | H01L 21/4853 |
| | | | | 257/659 |
| 2016/0268214 | A1* | 9/2016 | Yu | H01L 24/96 |
| 2017/0118877 | A1* | 4/2017 | Kumbhat | H01L 24/97 |
| 2017/0179041 | A1* | 6/2017 | Dias | H01L 21/31111 |

\* cited by examiner

*Primary Examiner* — Mark W Tornow
*Assistant Examiner* — Abbigale A Boyle
(74) *Attorney, Agent, or Firm* — Perkins Coie LLP

(57) ABSTRACT

A mold chase for packaging a compartmentally shielded multifunctional semiconductor is provided. The mold chase generally includes a first cavity and a second cavity separated by a trench plate positioned between a first component and a second component of the multifunctional semiconductor between which a compartmental shield is required. The mold chase is lowered into a molding position over the multifunctional semiconductor and a molding material is injected through an inlet sprue into the first and second cavities to surround the first and second components, respectively. After the molding material is cured, the mold chase is removed and an open trench is formed in the cured molding material by the trench plate. The open trench is filled with a conductive material to form the compartmental shield. A conformal shield may be added to cover the package.

8 Claims, 6 Drawing Sheets

SEMICONDUCTOR DEVICES WITH PACKAGE-LEVEL COMPARTMENTAL SHIELDING AND ASSOCIATED SYSTEMS AND METHODS

TECHNICAL FIELD

The present disclosure is generally directed to semiconductor devices, systems and methods, and in several embodiments to multifunctional semiconductor packages having package-level compartmental shielding.

BACKGROUND

Microelectronic devices, such as memory devices, microprocessors, and light emitting diodes, typically include one or more semiconductor dies mounted to a substrate and encased in a protective covering. The semiconductor dies are packaged to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact). The semiconductor dies include functional features, such as memory cells, processor circuits, interconnecting circuitry, etc. that may require shielding from other components.

In some examples, multiple semiconductor components are packaged together in a multifunctional package, or a System in Package (SiP), which generally refers to a semiconductor package containing different types of semiconductor devices, such as differ types of dies with different functionality, or other components packaged with semiconductor dies. In SiP arrangements, certain components may require shielding from other components within the same package. In such package-level shielding, one or more conductive shields are integrated within the protective covering to isolate components and compartmentalize the SiP. In conventional SiP shielding arrangements, multiple manufacturing process steps are required to integrate the shield.

DETAILED DESCRIPTION

Figure 1:
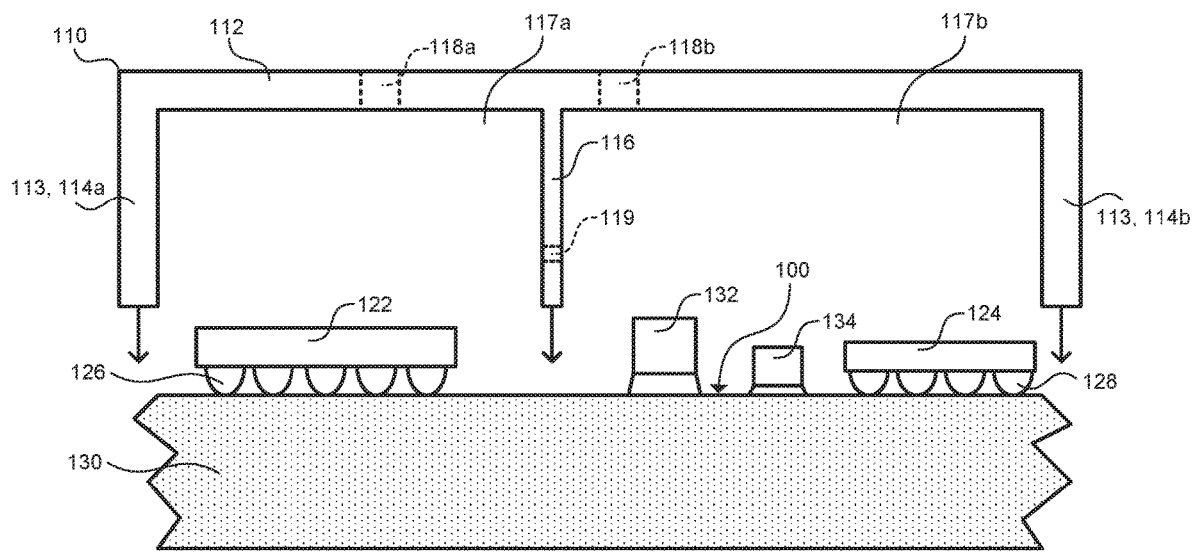
FIG. 1 is an enlarged cross-sectional view showing a semiconductor device configured in accordance with existing technology before packaging.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, diodes, and other devices with semiconductor materials. Furthermore, the term "semiconductor device" can refer to a finished device or assembly, or other structures at various stages of processing before becoming a finished device. In some embodiments, an individual semiconductor device may be "packaged" and include a molding material encasing the components and electrical connections in the device. In some embodiments, multiple semiconductor components are packaged together in a multifunctional package, such as a System in Package (SiP). SiPs generally contain multiple semiconductor devices, such as multiple dies with the same or different functionality. SiPs can also include other components packaged with semiconductor dies, or any combination of components.

Depending upon the context in which it is used, the term "substrate" can refer to a structure that supports electronic components (e.g., a die), such as a wafer-level substrate or to a singulated, die-level substrate, or another die for diestacking applications. A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

In SiP arrangements, certain components may require shielding from other components within the same multifunctional package. In such package-level shielding configurations, one or more shields are integrated within the protective covering between components to compartmentalize the SiP into shielded areas. In conventional SiP shielding processes, multiple manufacturing steps are generally required to integrate the shield to the SiP. For example, conventional SiP shielding integration involves: (a) mounting the semiconductor die package and other components to a substrate using surface-mount technology (SMT); (b) molding a molding material over the mounted components with a mold chase configured to form the shape of the package; (c) cutting a trench (e.g., with a laser) in the solid molding material to create a void for a shield; and (d) forming a shield made of conductive material in the trench to form the package-level shielded compartment.

A multifunctional package may include a compartmental shield to prevent interference between semiconductor components within the multifunctional package. The compartmental shield may be arranged between the semiconductor components of an SiP in a trough or trench in the package molding. In embodiments of the present technology, the package molding may be formed using a mold chase having a protrusion configured to form the trench during the molding process. The protrusion may be a trench plate or panel extending from a surface of the mold chase between the components of the SiP requiring shielding. As the molding material fills the cavities in the mold chase and covers the components of the SiP, the trench plate maintains a gap in the molding material for the shield. When the mold chase is removed from the multifunctional package, the package molding includes a trench between the molded structures that is formed by the trench plate. A shielding material (e.g., a conductive paste) is the deposited in the trench to form a compartmental shield. In some embodiments, a conformal shield is added over the package molding and the compartmental shield to further prevent interference with the components of the SiP. The conformal shield is formed using suitable processes, such as sputter deposition, plating, etc.

FIG. 1 is a cross-sectional side view of a multifunctional semiconductor system in package 100 ("SiP 100") before being packaged in accordance with embodiments of the present technology. In the illustrated embodiment, the SiP 100 includes a first die 122 electrically coupled to the substrate 130 through interconnects 126, a second die 124 electrically coupled to the substrate 130 through interconnects 128, and first antenna and second antennas 132 and 134 electrically coupled to the substrate 130. The SiP 100 may include several combinations of components mounted to a substrate 130, and thus the configuration of the SiP 100 in FIG. 1 is exemplary and should not be construed as limiting the present technology to the illustrated configuration. In this example, the components of the SiP 100 are arranged such that shielding is desired between the first die 122 and the combination of the second die 124, the first antenna 132, and the second antenna 134. In other embodiments, the shielding may be placed between any component of the SiP, or multiple compartmental shields may be placed between components of the SiP as required by design.

FIG. 1 also shows a mold chase 110 shaped to form molded structures that encase the components of the SiP 100 such that a compartmental shield can be formed in a trench between molded structures. The mold chase 110 is generally sized such that the packaging material adequately covers the components of the SiP 100 and provide a thickness needed for protection while being within dimension specifications of the SiP 100. The mold chase 110 may include a top panel 112, a sidewall 113 having first and second side panels 114a and 114b depending from the top panel 112, and a trench plate 116 depending from the top panel 112 at a location between the first and second side panels 114a and 114b. The mold chase 110 has a first cavity 117a defined by the first side panel 114a, the trench plate 116, and a portion of the top panel 112. The mold chase 110 also has a second cavity 117b defined by the second side panel 114b, the trench plate 116, and another portion of the top panel 112. The mold chase 110 can further include one or more sprues 118 (identified individually as 118a and 118b) through which molding material can be injected into or air can flow out from the first and/or second cavities 117a and 117b. Additionally, the mold chase 110 can have one or more passageways 119 in the trench plate 116 through which the molding material can flow between the first and second cavities 117a and 117b.

The mold chase 110 is configured to create a first molded structure in the first cavity 117a, a second molded structure in the second cavity 117b, and a trench between the molded structures after the molding material cures and the mold chase 110 is removed from the SiP 100. The trench plate 116 may extend from a surface of the mold chase 110 to contact the substrate 130 when the mold chase 110 is in position for molding (see, e.g., FIG. 2A). When the trench plate 116 contacts the substrate 130 during molding, the molding material can flow between the first and second cavities 117a and 117b via the passageways 119. In embodiments where the trench plate 116 extends only partially toward the substrate 130, the passageways 119 may be omitted as the molding material can flow under the trench plate 116.

Figure 2A:
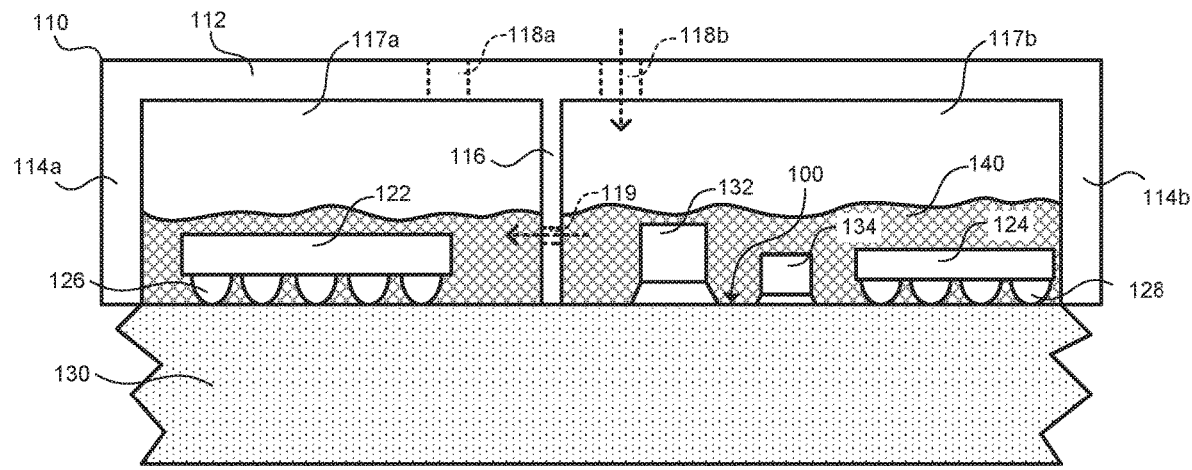
FIGS. 2A and 2B are enlarged cross-sectional side views showing a process of molding a material on the semiconductor device of FIG. 1.
Figure 2B:
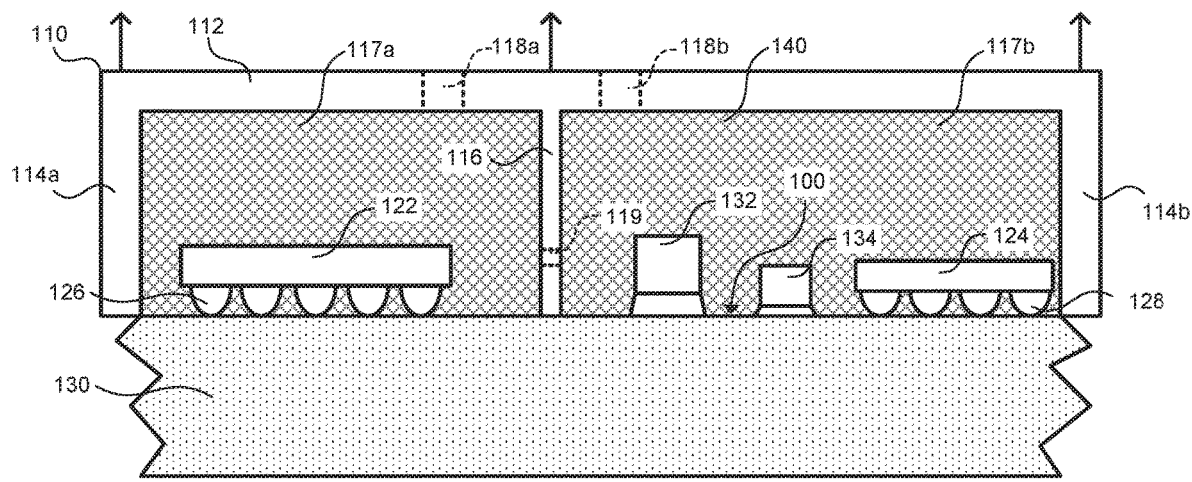

FIG. 2A shows an intermediate stage of injecting a molding material 140 into the second cavity 117b via sprue 118b to cover the second die 124, the interconnects 128, and the first and second antennas 132 and 134. Once the molding material 140 reaches the height of the passageways 119 in the trench plate 116, the molding material 140 flows into the first cavity 117a to cover the first die 122 and the interconnects 126. Air in the molding chase 110 can flow out through sprue 118b. The molding material 140 is generally injected into mold chase 110 until the first and second cavities 117a and 11b are full or at least nearly full. FIG. 2B shows the SiP 100 with the first and second cavities 102 and 104 full of molding material 140 forming the molded structures over the semiconductor components.

The molding material 140 may be a resin, epoxy resin, silicone-based material, polyimide, and/or any other suitable resin. Once deposited, the molding material 140 can be cured by UV light, chemical hardeners, heat, or other suitable curing methods. The molding material 140 can be shaped to expose one or more conductive pads, or a portion of the molding material can be removed with a tool (e.g., a grinder) to expose certain features of the SiP 100. In general, the molding material 140 may encapsulate the components of the SiP 100 such the components are sealed within the molding material 140 after curing. The one or more sprues 118 may cause artifacts in the molding material 140 after curing. As such, it may be possible to identify whether aspects of the present technology (e.g., a molding chase 110 having a trench plate 116) were used to manufacture an SiP 100, where the artifacts from the sprues 118 would be present in the molding material 140 on either side of the trench plate 116 after curing.

Figure 3:
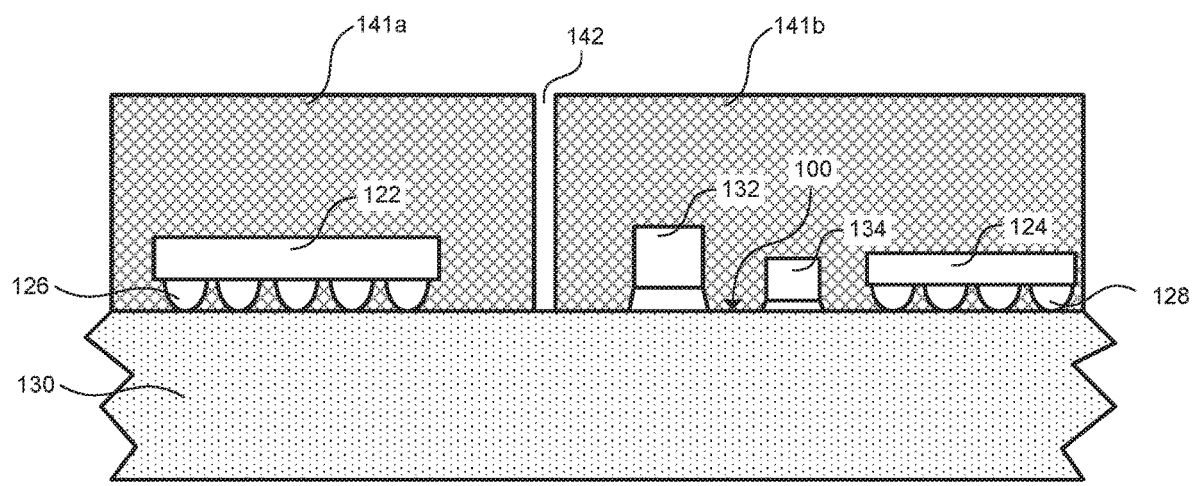
FIG. 3 is an enlarged cross-sectional view showing the semiconductor device of FIG. 1 after molding the material on the semiconductor device of FIG. 1.

FIG. 3 shows the process after at least partially curing the molding material 140 (FIG. 2B) and the mold chase 110 has been removed from the SiP 100 to form a first molded structure 141a, a second molded structure 141b, and an open trench 142 between the first and second molded structures 141a and 141b that was created by the trench plate 116. The open trench 142 is between components of the SiP 100 where compartmental shielding is desired. In contrast to compartmental shielding processes of conventional technology, the trench plate 116 creates the open trench 142 and the first and second molded structures 141a and 141b without an additional step of cutting the molding material using a laser, cutting wheel, or other cutting tool.

In some embodiments, the compartmental shield is an electromagnetic interference (EMI) shield arranged between the semiconductor die and another component in the SiP, such as an antenna structure. The EMI shield can prevent interference from electromagnetic radiation generated by the antenna structure and/or shield at least the antenna structure from interface generated by the semiconductor die. In some embodiments, the semiconductor device includes a package molding over at least a portion of the antenna, die, etc. A conformal shield may be placed over the package molding and the compartmental shield to isolate a package from other packages.

Figure 4A:
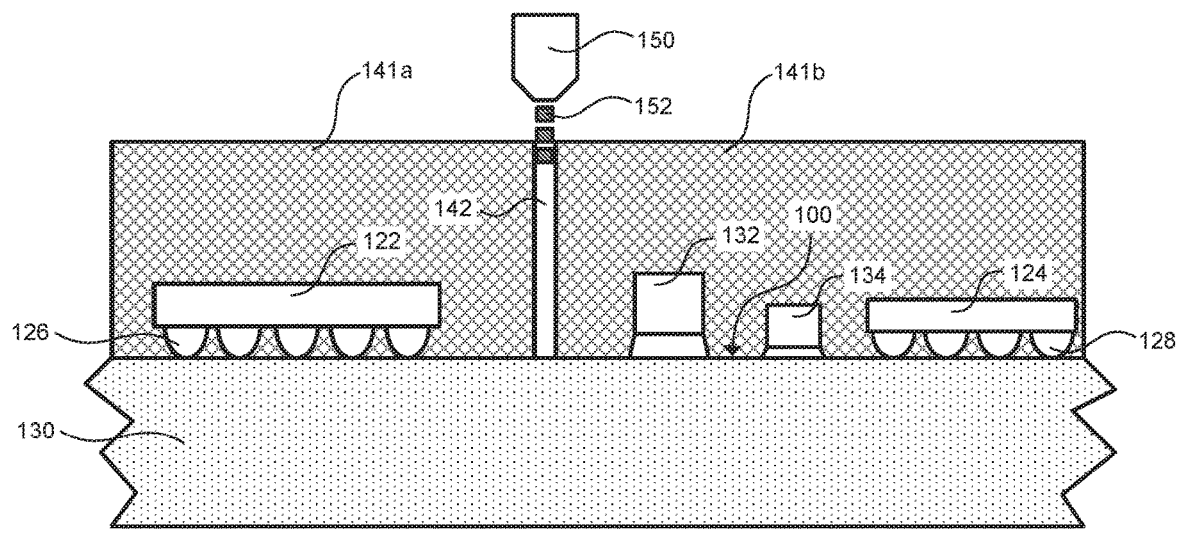
FIGS. 4A and 4B are enlarged cross-sectional side views showing stages of forming a compartmental shield in the packaging material on the device of FIG. 1.
Figure 4B:
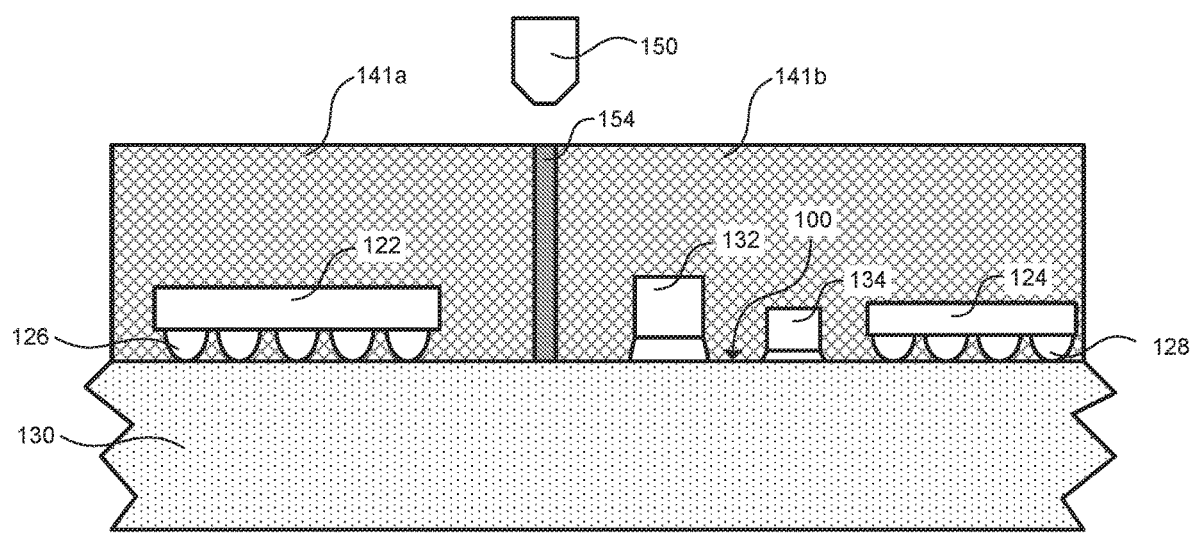

FIGS. 4A and 4B show a process of forming of a compartmental shield 154 (FIG. 4B) in the open trench 142. As shown in FIG. 4A, a dispensing head 150 dispenses conductive material 152 into the open trench 142. The conductive material 152 may be a conductive paste, a molten metal, or any other suitable material to shield interference between the components of the SiP 100. The conductive material 152 may be dispensed until the open trench 142 is full and the compartmental shield 154 is formed, as shown in FIG. 4B. The open trench 142 does not need to be filled completely with the conductive material 152. In general, the height of compartmental shield 154 should be sufficient to shield the components encased by the first molded structure 141a from the components encased by the second molded structure 141b. Although depth of the SiP 100 is not shown in the figures (i.e., the dimension perpendicular to the page), the compartmental shield 154 may extend the full depth of the package, or partially along the depth of the package. In other embodiments, the compartmental shield 154 is of any geometric or arcuate shape along the depth of the SiP 100.

Figure 5:
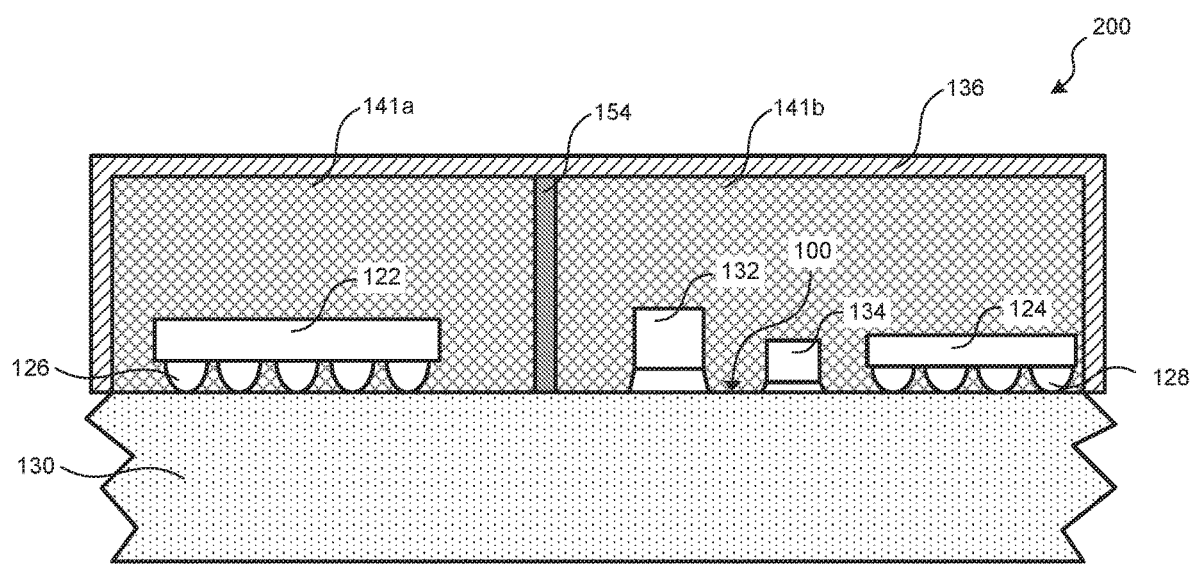
FIG. 5 an enlarged cross-sectional view showing the semiconductor device of FIG. 1 with a compartmental shield and a conformal shield.

FIG. 5 shows an embodiment in which the Sip 100 include an optional outer conformal shield 136 in addition to the compartmental shield 154. The conformal shield 136 may be disposed on the molding material 140 to cover the first and second molded structures 141a and 141b to further shield the components of the package. The conformal shield 136 may be formed using any suitable method, such as sputter deposition, chemical vapor deposition, plating, etc. The conformal shield 136 may cover the entire package or only a portion of the package.

Figure 6:
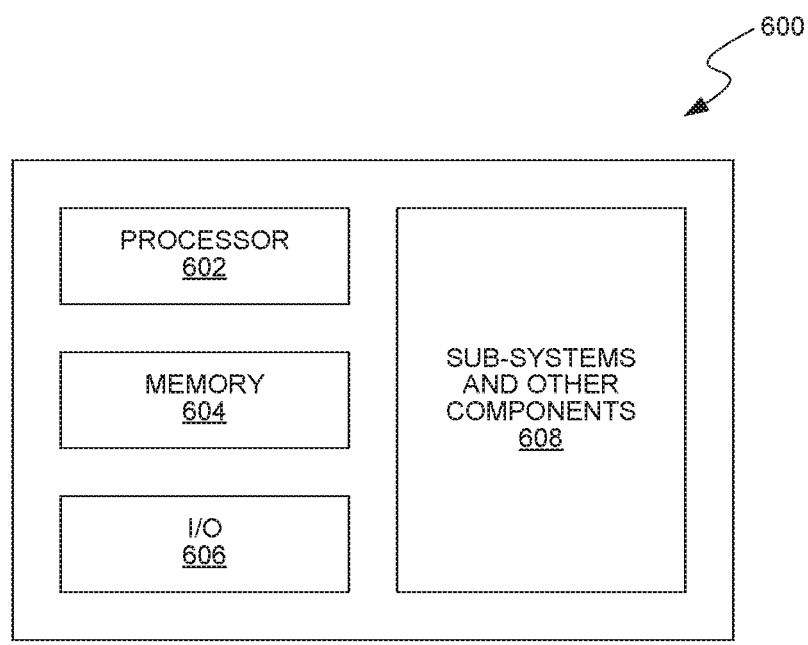
FIG. 6 is a schematic view of a system that includes a semiconductor device configured in accordance with embodiments of the present technology.

FIG. 6 is a block diagram illustrating a system that incorporates a semiconductor device in accordance with embodiments of the present technology. Any one of the semiconductor devices having the features described above with reference to FIGS. 1-5 can be incorporated into any of a myriad of larger and/or more complex systems, a representative example of which is system 600 shown schematically in FIG. 6. The system 600 can include a processor 602, a memory 604 (e.g., SRAM, DRAM, flash, and/or other memory devices), input/output devices 606, and/or other subsystems or components 608. The semiconductor assemblies, devices, and device packages described above with reference to FIGS. 1-5 can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. In these and other examples, the system 600 can be housed in a single unit or distributed over multiple interconnected units, e.g., through a communication network. The components of the system 600 can accordingly include local and/or remote memory storage devices and any of a wide variety of suitable computer-readable media.

Although many of the foregoing embodiments are described with respect to semiconductor devices, systems, and methods with compartmental shielding, other applications and other embodiments in addition to those described herein are within the scope of the present technology. Further, embodiments of the present technology can have different configurations, components, and/or procedures than those shown or described herein, and these and other embodiments can be used without several of the configurations, components, and/or procedures shown or described herein without deviating from the present technology.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

We claim:

1. A method of shielding a compartment of a multifunctional semiconductor, the method comprising:
    positioning a mold chase into a molding position with respect to the multifunctional semiconductor, the mold chase having a top panel with a sprue, a sidewall extending from a perimeter of the top panel, and a trench plate projecting from the top panel at a position between a first component and a second component of the multifunctional semiconductor to define a first cavity and a second cavity, wherein the side panel contacts a substrate of the multifunctional semiconductor in the molding position;
    injecting a molding material through the sprue into the first cavity, wherein the trench plate has a passageway to fluidly couple the first cavity and the second cavity to flow the molding material from the first cavity to the second cavity, wherein the passageway is spaced apart from the substrate of the multifunctional semiconductor along the trench plate;

removing the mold chase to form a first molded structure encasing the first component, a second molded structure encasing the second component, and an open trench between the first and second molded structures;

filling the open trench with a conductive material to form a compartmental shield between the first and second components; and forming an outer conformal shield on the first and second molded structures separately from forming the compartmental shield.

2. The method of claim 1, wherein the trench plate extends to contact the substrate in the molding position and completely separate the first cavity from the second cavity.

3. The method of claim 1, wherein the conformal shield is applied to exposed surfaces of the first molded structure, the second molded structure, and the compartmental shield using sputter deposition.

4. The method of claim 1, wherein the molding material is selected from the group consisting of a resin, an epoxy resin, a silicone-based material, a polyimide, and combinations thereof.

5. A method of shielding a compartment and a package of a multifunctional semiconductor, the method comprising:

positioning a mold chase into a molding position over the multifunctional semiconductor, the mold chase having a first cavity surrounding a first component of the multifunctional semiconductor, a second cavity surrounding a second component of the multifunctional semiconductor, and a trench plate between the first cavity and the second cavity;

injecting a molding material through an inlet sprue into the first cavity to surround the first component, wherein the trench plate has a passageway to fluidly couple the first cavity and the second cavity to flow the molding material from the first cavity into the second cavity to surround the second component, wherein the passageway is spaced apart from a substrate of the multifunctional semiconductor along the trench plate;

removing the mold chase to form an open trench in the cured molding material by the trench plate;

filling the open trench with a conductive material to form a compartmental shield; and covering the molding material and the compartmental shield with a conformal shield separately from forming the compartmental shield.

6. The method of claim 5, wherein the trench plate extends to contact the substrate in the molding position and separate the first cavity from the second cavity.

7. The method of claim 5, wherein the conformal shield is applied to exposed surfaces of the molding material and compartmental shield using sputter deposition.

8. The method of claim 5, wherein the molding material is selected from the group consisting of a resin, an epoxy resin, a silicone-based material, a polyimide, and combinations thereof.

* * * * *